(12) United States Patent
Liu

(10) Patent No.: US 10,971,458 B2
(45) Date of Patent: Apr. 6, 2021

(54) COMPENSATION NETWORK FOR HIGH SPEED INTEGRATED CIRCUITS

(71) Applicant: CREDO TECHNOLOGY GROUP LIMITED, Grand Cayman (KY)

(72) Inventor: Xike Liu, San Jose, CA (US)

(73) Assignee: CREDO TECHNOLOGY GROUP LIMITED, Grand Cayman (KY)

( * ) Notice: Subject to any disclaimer, the term of this patent is extended or adjusted under 35 U.S.C. 154(b) by 303 days.

(21) Appl. No.: 16/241,481

(22) Filed: Jan. 7, 2019

(65) Prior Publication Data
US 2020/0219828 A1    Jul. 9, 2020

(51) Int. Cl.
*H01L 23/60* (2006.01)
*H01L 23/00* (2006.01)
*H01L 23/66* (2006.01)
*H01L 27/02* (2006.01)

(52) U.S. Cl.
CPC .............. *H01L 23/60* (2013.01); *H01L 23/66* (2013.01); *H01L 24/09* (2013.01); *H01L 24/17* (2013.01); *H01L 27/0248* (2013.01); *H01L 2223/6605* (2013.01); *H01L 2223/6672* (2013.01); *H01L 2223/6688* (2013.01); *H01L 2924/1206* (2013.01)

(58) Field of Classification Search
CPC ..... H01L 2223/6605; H01L 2223/6672; H01L 2223/6688; H01L 23/60; H01L 23/645; H01L 23/66; H01L 24/09; H01L 24/17; H01L 27/0248; H01L 2924/1206
See application file for complete search history.

(56) References Cited

U.S. PATENT DOCUMENTS

| 5,969,929 A | 10/1999 | Kleveland et al. |
| 6,459,343 B1 * | 10/2002 | Miller ................. H01L 24/49 333/32 |
| 8,368,174 B1 | 2/2013 | Jiang et al. |

(Continued)

FOREIGN PATENT DOCUMENTS

CN        109388826 A        2/2019

OTHER PUBLICATIONS

Galal, Sherif. Broadband ESD Protection Circuits in CMOS Technology, IEEE Journal of Solid-State Circuits, Dec. 2003, 2334-2340, vol. 38, No. 12.

(Continued)

*Primary Examiner* — Jared Fureman
*Assistant Examiner* — Nicolas Bellido
(74) *Attorney, Agent, or Firm* — Ramey & Schwaller LLP; Daniel J. Krueger

(57) ABSTRACT

Illustrative impedance matching circuits and methods provide enhanced performance without meaningfully increasing cost or areal requirements. One illustrative integrated circuit embodiment includes: a pin configured to connect to a substrate pad via a solder bump having a parasitic capacitance; an inductor that couples the pin to a transmit or receive circuit; a first electrostatic discharge (ESD) protection device electrically connected to a pin end of the inductor; and a second ESD protection device electrically connected to a circuit end of the inductor, where the first ESD protection device has a first capacitance that sums with the parasitic capacitance to equal a total capacitance coupled to the circuit end of the inductor.

16 Claims, 4 Drawing Sheets

(56) References Cited

U.S. PATENT DOCUMENTS

| | | | |
|---|---|---|---|
| 8,723,293 B1 * | 5/2014 | Jiang | H01L 23/645 257/531 |
| 9,543,757 B2 | 1/2017 | Tsai | |
| 2019/0050519 A1 | 2/2019 | Dai | |

OTHER PUBLICATIONS

Non-Final Office Action dated Aug. 23, 2019 in U.S. Appl. No. 16/026,950.

Notice of Allowance dated Mar. 26, 2020 in U.S. Appl. No. 16/026,950.

* cited by examiner

COMPENSATION NETWORK FOR HIGH SPEED INTEGRATED CIRCUITS

FIELD

The disclosure relates generally to electronics. The disclosure relates specifically to terminating high speed data links for integrated circuit devices.

BACKGROUND

As integrated circuits (IC) become smaller and faster, it becomes more challenging to satisfy their input/output (I/O) requirements. Parallel data buses are hampered by skew, crosstalk, and other problems related to electronic packaging and signal integrity. Skew (the difference in arrival times of parallel data signals) now often approaches or exceeds the symbol interval of high rate communications signals, and as signaling frequencies continue to increase, crosstalk also grows ever more severe. As packages grow ever smaller, they create physical limits on the number and spacing of I/O pins that can be supported. (As used herein, the term "pin" refers to an electrical contact for connecting an IC to a substrate upon which the IC is mounted.)

Serial I/O has certain advantages, including reduced pin counts and less interference between adjacent links. To enable multiple signals to be carried serially, serial I/O buses are equipped with Serializer/Deserializer (SERDES) interfaces. The serializer portion of the SERDES interface accepts a parallel data link input and condenses it into fewer lines of a serial data link output. The deserializer portion of the SERDES interface accepts a serial data link input and expands it to reconstruct the original parallel data. SERDES is beneficial because it enables serial I/O to be used to solve the problems of traditional parallel I/O. SERDES interfaces include a receiver circuit and a transmitter circuit, which may be included as part of any integrated circuit (IC) such as a switching IC for routing data transfers from among various other chips.

Serial I/O communications generally take place across a channel that is much longer than a representative wavelength of the signal. Accordingly, electromagnetic transmission line models may be the best approach to analyzing the channel. If the impedance of the driver does not match the characteristic impedance of the channel, the driver is unable to efficiently deliver power to the channel. If the input impedance of the receiving terminal does not match the characteristic impedance of the channel, the channel is unable to efficiently deliver the signal to the terminal. Such mismatches cause signal reflections, and if more than one mismatch exists, the signal reflections can make multiple round trips, causing signal interference and loss. The round trip delay enables such interference to affect subsequent symbols, generally increasing the difficulty of timing recovery and increasing the bit-error rate (BER).

Electronic devices typically employ ICs that are mounted on a substrate such as a circuit board or interposer. Such mounting is usually done with solder bumps connecting the pins to pads on the substrate. Before or during mounting (or occasionally, afterwards), IC pins may be subject to an electrostatic discharge (ESD); a high-voltage transient that can damage the internal elements of the IC unless the IC incorporates some form of ESD protection. The principle of ESD protection is twofold: to provide a low-impedance discharging path to shunt ESD currents and to clamp pin-voltage to a safe level to avoid dielectric breakdown. Numerous devices may be used for the ESD elements including, for example, diodes, MOS transistors, and CMOS output device. The inherent capacitance of ESD protection devices can be significant in a state-of-the-art CMOS technology, e.g., in the range 2 to 8 pF. At high frequencies, the reactance associated with this large capacitance becomes comparable to the 50Ω characteristic impedance of the package and board interfaces. This may cause significant reflections and severely limits the chip-to-chip signal bandwidth.

FIGS. 1 and 2 are schematics representing a conventional Rx circuit and a conventional Tx circuit in an assembled semiconductor package. The figures show single-ended transmission line models to more clearly illustrate the principles of this disclosure, but as a practical matter differential signaling is preferred for its greater noise immunity and reduced attenuation. Those in the art should readily understand the interrelation between single-ended and differential signaling designs and how to convert a device implementation between these modes.

In FIG. 1, a solder bump 102 electrically connects a package substrate pad 101 to a pin of a SERDES Rx circuit 110. An ESD protection circuit 104 is coupled to the pin to protect against ESD, and a termination element 105 is coupled to the pin to provide bias and/or approximate impedance matching. The ESD protection circuit 104 may include a diode, a n-type metal oxide semiconductor transistor having its gate grounded, a silicon-controlled rectifier, or alternative mechanism for dissipating high voltage transients without harming the Rx circuit 110. Similarly, in FIG. 2, a bump 103 electrically connects a different package substrate pad 101 to a pin of a SERDES Tx circuit 120. An ESD protection circuit 106 is coupled to the pin to protect against ESD. While a separate termination element may be present, it is more common for the Tx circuit 120 to have voltage bias and/or approximate impedance matching as an inherent feature of the driver design.

Solder bumps not only provide electrical connection, but typically must also serve as a structural link and heat flow path between the chip and the substrate package. (The bond wire technique employed in traditional semiconductor packaging may suffer from parasitic inductances that make bond wires less suitable for high-speed signaling.) Due to these other functions as well as physical limitations of bonding machines, solder bump sizes are not reduced in proportion to the IC line widths. Accordingly, the solder bumps 102, 103, generally exhibit an irreducible parasitic capacitance with the ground plane of the package substrate. As I/O signaling rates advance into the gigahertz range, this small parasitic capacitance, alone or in combination with the IC's internal capacitances, may be enough to cause reflections and signal loss.

FIG. 3 is a schematic representation for FIGS. 1 and 2, including the parasitic capacitances. The schematic is a parallel arrangement of five elements between the signal line and ground, numbered roughly in order of the size of their effects. Element R1 is a resistor representing the termination element, element C2 is a capacitor representing the capacitance of the ESD protection circuit, element C3 is a capacitor representing the input capacitance of the Rx circuit (or the output capacitance of the Tx circuit), element C5 is a capacitor representing the parasitic capacitance of the termination element, and C6 is a capacitor representing the parasitic capacitance of the solder bump connection. The capacitances combine additively and their effect on the impedance mismatch is magnified at higher frequencies.

Conventional solutions to impedance mismatch include, for example, minimizing the parasitic capacitance by, e.g., increasing separation of the signal line from ground to reduce capacitive coupling. However, the inherent capacitances of the circuit, termination, ESD, and bump, often cannot be satisfactorily reduced.

An article by Sherif Galal et al., entitled "Broadband ESD Protection Circuits in CMOS Technology", IEEE JOURNAL OF SOLID-STATE CIRCUITS, VOL. 38, NO. 12, DECEMBER 2003, suggests using a T-coil circuit between the signal line and the ESD-protected Tx or Rx circuit on the IC to minimize the effects of the ESD capacitance. FIG. 4 shows an illustrative T-coil circuit having nodes A, B, and X. Node A is coupled to a signal line represented by equivalent circuit elements Vin and RS. Node X couples to the ESD-protected Tx or Rx circuit as represented by equivalent circuit element CL. Node B couples to the termination element represented by equivalent resistance RT. The T-coil circuit consists of mutually-coupled inductors L1 and L2 in series between nodes A and B, with their intermediate terminal coupled to Node X. The inductors have a mutual coupling coefficient k. The T-coil further includes a bridge capacitor CB couple between Nodes A and B. If designed properly, the T-coil circuit displays a purely resistive input impedance thus may offer good impedance matching over a wide frequency range. However, this technique entirely fails to address the parasitic capacitance of the solder bump.

U.S. Pat. No. 8,368,174 to Xiaohong Jiang et al. suggests using an inductor between bump and the ESD-protected Rx circuitry to form a pi-configuration, which may in some cases offer improved insertion performance. If this technique is applied to our present SERDES example, the schematic representation becomes that shown in FIG. 5. An element L3 representing an inductor is coupled between element C6 (representing the parasitic capacitance of the solder bump) and the remaining elements (representing the ESD protection, termination element, and Tx or Rx circuit). However, this technique performs poorly when the ESD capacitance and/or capacitance of the Tx/Rx circuitry is dominant.

SUMMARY

Accordingly, there are disclosed herein illustrative impedance matching circuits and methods that provide enhanced performance without meaningfully increasing cost or areal requirements. One illustrative integrated circuit embodiment includes: a pin configured to connect to a substrate pad via a solder bump having a parasitic capacitance; an inductor that couples the pin to a transmit or receive circuit; a first electrostatic discharge (ESD) protection device electrically connected to a pin end of the inductor; and a second ESD protection device electrically connected to a circuit end of the inductor, where the first ESD protection device has a first capacitance that sums with the parasitic capacitance to equal a total capacitance coupled to the circuit end of the inductor.

One illustrative method embodiment for providing an integrated circuit pin with electrostatic discharge (ESD) protection includes: estimating a parasitic capacitance of a solder bump connecting the pin to a substrate pad; coupling the pin to an on-chip circuit with an inductor; connecting a first ESD protection device to a pin end of the inductor, the first ESD protection device having a first capacitance that combines with the parasitic capacitance to provide a first total capacitance at the pin end; and connecting a second ESD protection device to a circuit end of the inductor, the second ESD protection device having a second capacitance that combines with a capacitance of the on-chip circuit to provide a second total capacitance at the circuit end, where the first total capacitance matches the second total capacitance.

Each of the foregoing embodiments may be implemented individually or in combination, and may be implemented with any one or more of the following features in any suitable combination: 1. the second ESD protection device has a second capacitance. 2. said transmit or receive circuit is a transmit circuit having an output capacitance. 3. the total capacitance comprises a sum of the second capacitance with the output capacitance. 4. said transmit or receive circuit is a receive circuit having an input capacitance. 5. the total capacitance comprises a sum of the second capacitance with the input capacitance and a parasitic capacitance of a termination element. 6. inductance of the inductor is set based at least in part on the total capacitance and a characteristic impedance expected for a signal line connecting to the substrate pad. 7. an inductance of the inductor is set based at least in part on the total capacitance to match, at a selected frequency, the characteristic impedance expected for a signal line connecting to the substrate pad. 8. the circuit further includes: a second pin configured to connect to a second substrate pad via a second solder bump having a second parasitic capacitance; a second inductor that couples the second pin to said transmit or receive circuit to carry a differential signal; a third electrostatic discharge (ESD) protection device electrically connected to a pin end of the second inductor; and a fourth ESD protection device electrically connected to a circuit end of the inductor. 9. the third ESD protection device has a third capacitance that sums with the second parasitic capacitance to equal a second total capacitance coupled to the circuit end of the second inductor. 10. the on-chip circuit includes a transmit circuit of a serializer/deserializer. 11. the on-chip circuit includes a receive circuit of a serializer/deserializer. 12. the second total capacitance includes a parasitic capacitance of a termination element. 13. the inductor has an inductance that, in combination with the first and second total capacitances, matches a characteristic impedance of a substrate signal line attached to the pad with an input or output impedance of said pin when soldered. 14. determining a working frequency for a signal to be communicated via the pin, where said characteristic impedance matching occurs at the working frequency. 15. the method further includes: determining a working frequency for a signal to be communicated via the pin; and selecting a total ESD protection device size based at least in part on the working frequency, where the first ESD protection device and second ESD protection device together provide the total ESD protection device size. 16. evaluating performance of the first and second ESD protection devices in response to an ESD event at the pin. 17. increasing a size of at least one of the first and second ESD protection devices if the performance is inadequate. 18. said increasing includes: increasing the total ESD protection device size; and apportioning the increase between the first and second ESD protection devices to maintain the match between the first and second total capacitances. 19. determining design parameter values for the inductor by including impedance match as a optimization parameter.

BRIEF DESCRIPTION OF THE DRAWINGS

In order that the manner in which the above-recited and other enhancements and objects of the disclosure are obtained, a more particular description of the disclosure briefly described above will be rendered by reference to specific embodiments thereof which are illustrated in the appended drawings. Understanding that these drawings depict only typical embodiments of the disclosure and are therefore not to be considered limiting of its scope, the disclosure will be described with additional specificity and detail through the use of the accompanying drawings in which.

DETAILED DESCRIPTION

The particulars shown herein are by way of example and for purposes of illustrative discussion of the preferred embodiments of the present disclosure only and are presented in the cause of providing what is believed to be the most useful and readily understood description of the principles and conceptual aspects of various embodiments of the disclosure. In this regard, no attempt is made to show structural details of the disclosure in more detail than is necessary for the fundamental understanding of the disclosure, the description taken with the drawings making apparent to those skilled in the art how the several forms of the disclosure may be embodied in practice.

Figure 6:
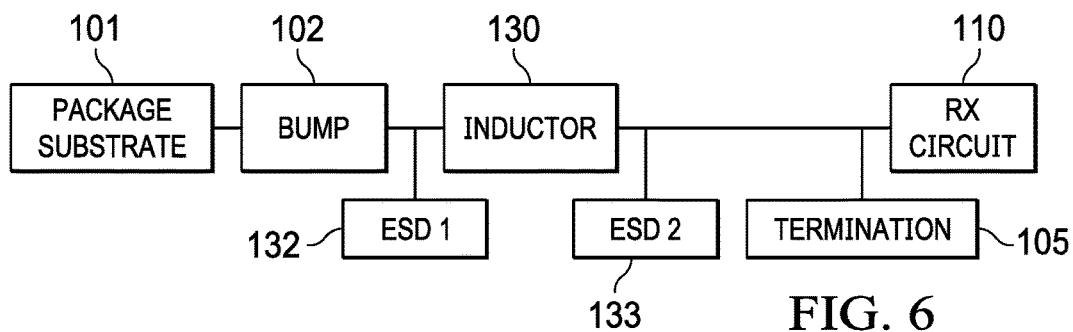
FIG. 6 is a schematic representing an enhanced Tx/Rx circuit.

FIG. 6 is a schematic diagram of an I/O circuit manufactured in an IC and assembled in a semiconductor package according to one embodiment of the present invention. The I/O circuit includes a solder bump 102 coupling a package substrate pad 101 to a pin of an Rx circuit 110. As before, a termination element 105 is coupled to the pin to provide a voltage bias and/or assist with impedance matching. ESD protection is here provided in the form of two smaller ESD protection devices 132, 133, each coupled to the pin to protect the Rx circuit 110 against high voltage transients. An inductance 130 is coupled between: (a) the bump 102 and a first of the ESD protection devices 132; and (b) the second of the ESD protection devices 133, the termination element 105, and the Rx circuit 110.

The ESD protection devices 132, 133 may each include a diode, a n-type metal oxide semiconductor transistor having its gate grounded, a silicon-controlled rectifier, or an alternative mechanism for dissipating high voltage transients. Each ESD protection device possesses an inherent capacitance, but that capacitance is a function of the device size. Because two devices are employed instead of one, the total ESD capacitance can be divided between the two devices. The division of the ESD capacitance between the two devices is controlled by the relative size of the two ESD protection devices. If, for example, an existing design provide ESD protection using a diode having a given P-N junction area, that diode may be replaced with two diodes having P-N junction areas that sum to equal the given P-N junction area of the existing design. If the junction area of a first diode is 25% of the original junction area, its small signal capacitance will be 25% of the small signal capacitance of the original diode, at least to a first order of approximation. The second diode would then have a junction area and small signal capacitance that is 75% of the original diodes' junction area and capacitance.

Accordingly, the design of FIG. 6 offers a pi-configuration in which the capacitances on either side of the inductor can be balanced. Each of the ESD devices could take the form of multiple ESD devices in parallel, and the design's ability to balance capacitances would continue to exist. When the capacitances on either side of the inductor are approximately equal, this enhanced design offers excellent impedance matching over a wide frequency range.

Figure 7:
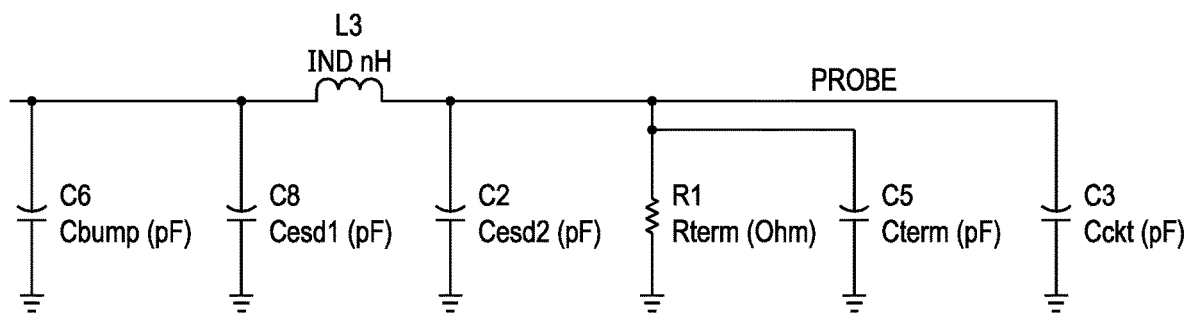
FIG. 7 is a schematic representation for the enhanced Tx/Rx circuit.

FIG. 7 is a schematic representation of an equivalent model for the enhanced I/O circuit. The model includes a parallel arrangement of a termination resistance (R1), a first ESD capacitance (C2), an input capacitance for the Rx circuit (C3), and a parasitic capacitance of the termination element (C5). A second ESD capacitance (C8) is arranged in parallel with the bump's parasitic capacitance (C6). As before, the parallel capacitances combine additively. The two parallel arrangements are connected by the inductor (L3).

In essence, distributing the ESD protection to both sides of the inductor enables the same level of ESD protection to be maintained while increasing C8 and reducing C4. This extra degree of control enables the design to provide a net reduction in reactive impedance, thereby reducing high-frequency loss and signal reflection. For best performance the parasitic capacitances before and after the inductor should be equal, as this is the ideal form for a pi network. Thus, in FIG. 6, $$C_{bump}+C_{esd1}=C_{esd2}+C_{term}+C_{ckt}$$

The inductance of the inductor 130 may be selected to negate the reactance of the capacitances of the circuit for a target operating frequency. Thus, both high-frequency loss due to parasitic capacitance, and signal reflection caused by impedance mismatch are substantially reduced. In some embodiments, the inductor 130 is implemented by a single on-chip inductor to save considerable die space. In one embodiment, the on-chip inductor is a planar spiral inductor, structural parameters such as the outer dimension, number of turns, the distance between the centers of lines, and substrate property are all factors in determining the performance and reactance value of the inductor. Guidance for inductor design is available in the academic literature.

Although the design of FIG. 6 includes a Rx circuit, the disclosed principles also apply to the Tx circuit. While a single ended model is shown for illustrative purposes, the principles also apply to differential signal transmitters and receivers.

Figure 8:
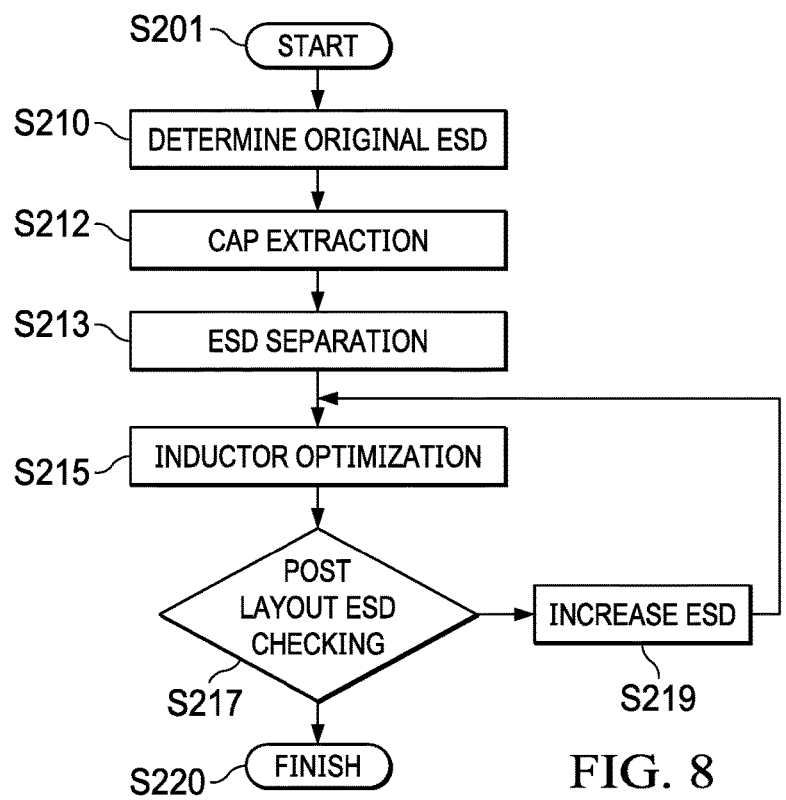
FIG. 8 is a flow diagram of an illustrative impedance match design method.

FIG. 8 is a flow diagram of an illustrative method for designing an impedance match circuit for an I/O of an integrated circuit. The process starts at S201 and proceeds to S210.

At S210, the type and size of the ESD device is determined in accordance with existing practices for providing ESD protection to I/O pins of an IC circuit. Note that the type and size of ESD protection device partly depends on the working frequency for communications on the I/O pin. The working frequency of the I/O may correspond to the baud rate for signal transmission between IC chip and other devices in the system. Performance of the ESD protection device can be verified by simulations using different ESD Test Models, such as the human body model (HBM) which simulates ESD events that occur when a charged human body contacts an electronic device directly. The machine model (MM) describes an ESD pulsing event where charged machinery discharges when touching IC parts during testing. The charged device model (CDM) simulates self-induced discharging of devices where un-grounded electronic parts are charged up during manufacturing or assembly and then discharge through a ground pin. An ideal ESD structure should feature low-R, low-holding, non-destructive path to shunt ESD pulses of all modes.

At S212, the equivalent impedance values of the circuit elements coupled to the I/O pin are determined. An equivalent circuit model may be employed in accordance with the example of FIG. 6. In one embodiment, the extracted equivalent impedance values include the characteristic impedance of the signal line on the package substrate, the parasitic capacitance of the solder bump, the inherent capacitance of the chosen ESD protection device, the resistance and parasitic capacitance of the termination element, and the inherent capacitance of the Tx or Rx circuit.

As S213, the selected ESD protection device is divided into at least two ESD devices to balance the capacitance on either side of the inductor. Ideally, the two ESD devices are sized to provide the same ESD protection as the original ESD device, and to balance the capacitance according to the equation $$C_{bump} + C_{esd1} = C_{esd2} + C_{term} + C_{ckt}$$

In most cases, the inherent capacitance of the ESD devices scales with the area of their PN junction, so the area of the first ESD protection device's junction may be increased by the amount that the second ESD protection device's junction is decreased to maintain the ESD performance and total capacitance while adjusting the balance between the opposite ends of the inductor.

At S215, the size of the inductor is optimized to match the characteristic impedance of the signal line on the package substrate at the working frequency. The purpose of optimizing the inductor is to reduce signal loss and reflection. Return loss or system response, can be used as the target of the optimization. Return loss is the ratio between the reflected wave amplitude and input wave amplitude. The optimization process can be implemented in accordance with methods well-known to those familiar with the art. For example, if using a lumped-element model to perform the optimization, a closed-form equation may be derived and solved to determine the optimum value. If optimizing the various dimensional and material parameters of an inductor design, a suitable non-linear optimization method such as Levenberg-Marquadt may be employed to determine the optimum parameter values.

At S217, a post layout check is performed to verify the performance of the I/O impedance match circuit, including the performance of the ESD protection devices in response to an ESD event. With the foregoing modifications, the circuit may fail to provide an adequate low-R, low-holding, non-destructive path to shunt ESD pulses of all modes.

At S219, the size of one or both ESD protection devices is adjusted if the chip can not meet the ESD requirement. For example the total ESD device size may be increased by 5%, and the individual ESD protection devices adjusted as needed to provide the total size while maintaining a balance in capacitances on either side of the inductor. Blocks S215-S219 may be iterated until a suitable design is identified, at which point the method concludes in block S220.

Figure 1:
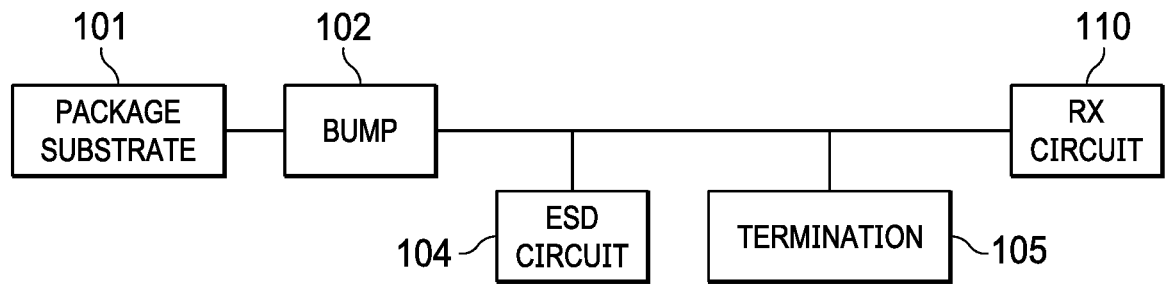
FIG. 1 is a schematic diagram representing a conventional Rx circuit.
Figure 2:
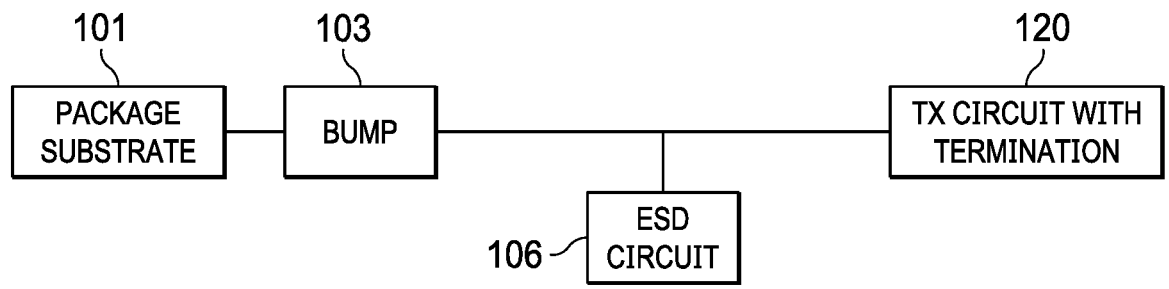
FIG. 2 is a schematic diagram representing a conventional Tx circuit.
Figure 3:
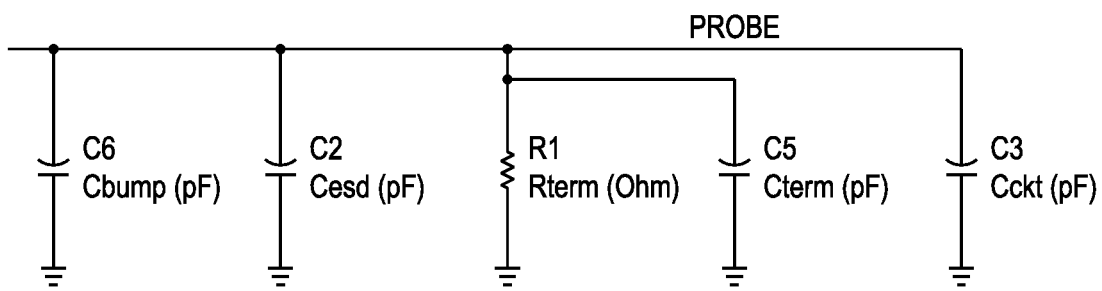
FIG. 3 is a schematic representation for the foregoing conventional circuits.
Figure 4:
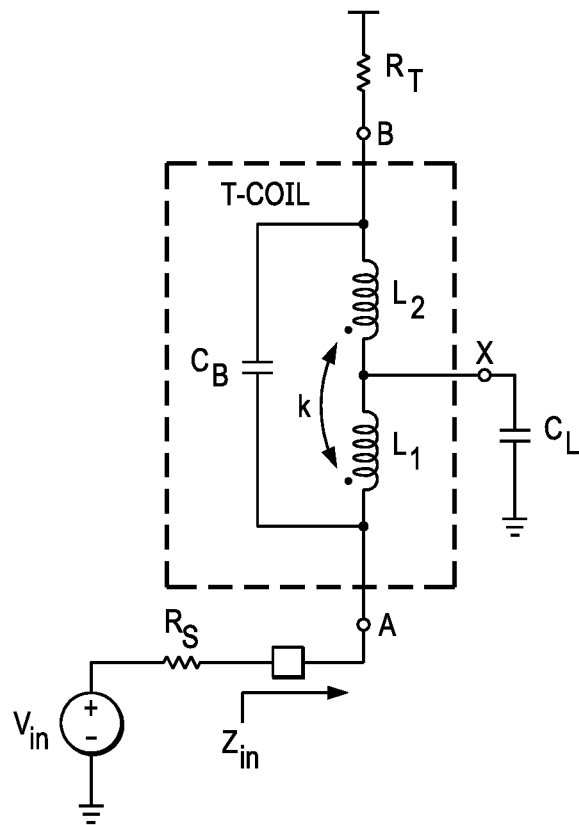
FIG. 4 is a schematic of an illustrative T-coil circuit.
Figure 5:
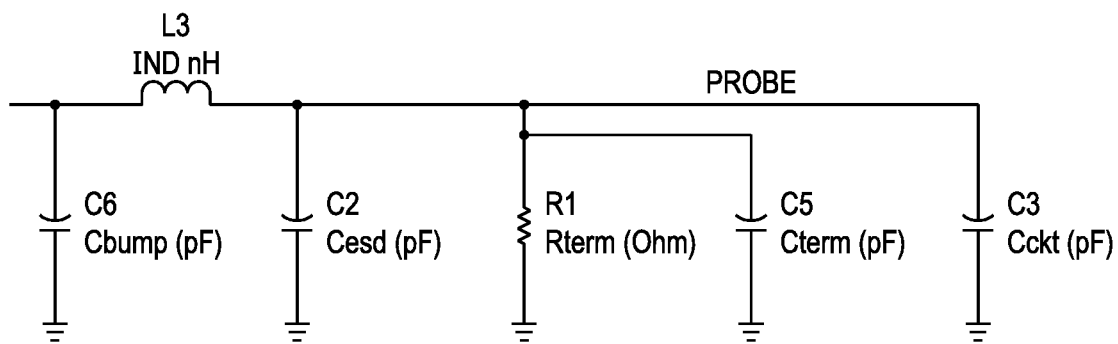
FIG. 5 is a schematic representation for a pi-configuration.
Figure 9:
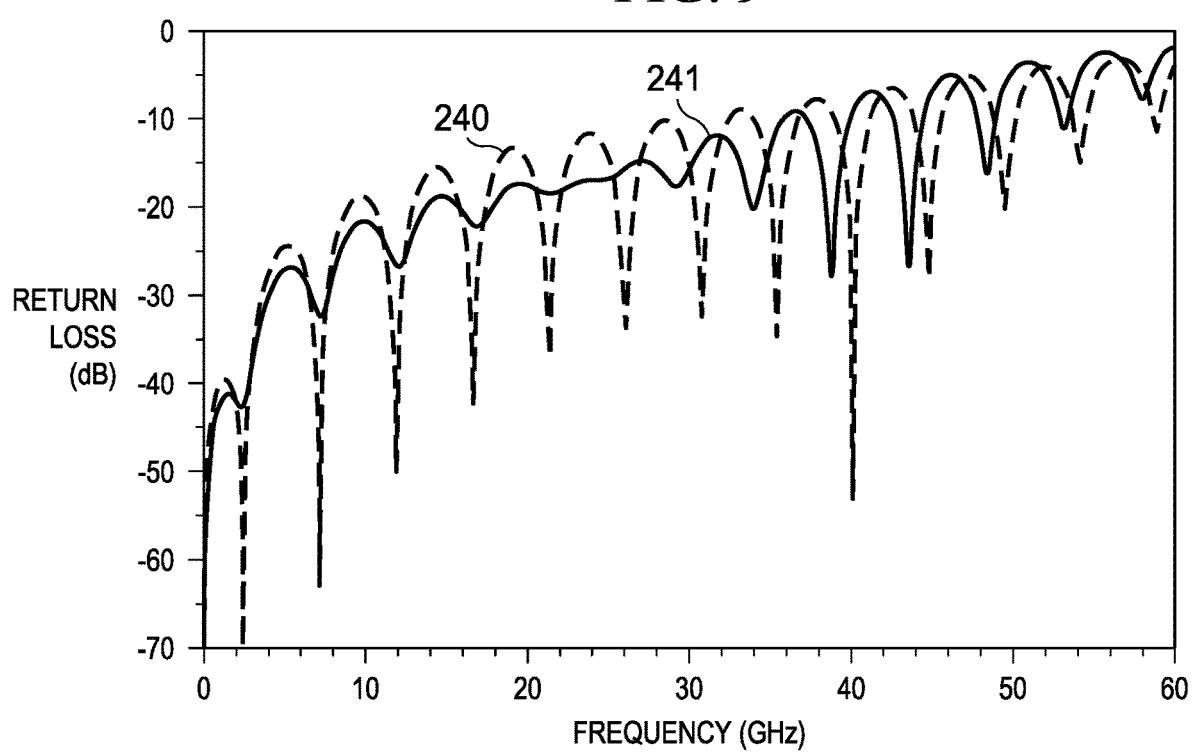
FIG. 9 is a plot of an illustrative return loss versus frequency.

FIG. 9 shows an illustrative plot of the return loss over a frequency range for a circuit designed in accordance with the foregoing principles. The X axis of the plot corresponds to frequency, and the Y axis of the plot corresponds to the return loss in DB. The plot includes a first curve 240 corresponding to a return loss frequency characteristic of a circuit using the design of FIG. 5, and a second curve 241 corresponding to a return loss frequency characteristic of a circuit using the design of FIG. 7. The return loss of the second curve 241 is generally lower than the first curve 240 from low frequency up to 40 GHz. Better system performance is achieved because of lower reflection losses due to improved impedance matching.

The method and circuit described herein can be incorporated into any suitable circuit, including processors and programmable logic devices (PLDs). The PLDs can include programmable array logic (PAL), programmable logic arrays (PLAs), field programmable logic array (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs).

Numerous alternative forms, equivalents, and modifications will become apparent to those skilled in the art once the above disclosure is fully appreciated. It is intended that the claims be interpreted to embrace all such alternative forms, equivalents, and modifications that are encompassed in the scope of the appended claims.

What is claimed is:

1. An integrated circuit (IC) that comprises:
   a pin configured to connect to a substrate pad via a solder bump having a parasitic capacitance;
   an inductor that couples the pin to a transmit or receive circuit;
   a first electrostatic discharge (ESD) protection device electrically connected to a pin end of the inductor; and
   a second ESD protection device electrically connected to a circuit end of the inductor,
   wherein the first ESD protection device has a first capacitance that sums with the parasitic capacitance to equal a total capacitance coupled to the circuit end of the inductor.

2. The IC of claim 1, wherein the second ESD protection device has a second capacitance, wherein said transmit or receive circuit is a transmit circuit having an output capacitance, and wherein the total capacitance comprises a sum of the second capacitance with the output capacitance.

3. The IC of claim 1, where in the second ESD protection device has a second capacitance, wherein said transmit or receive circuit is a receive circuit having an input capacitance, and wherein the total capacitance comprises a sum of the second capacitance with the input capacitance and a parasitic capacitance of a termination element.

4. The IC of claim 1, wherein an inductance of the inductor is set based at least in part on the total capacitance and a characteristic impedance expected for a signal line connecting to the substrate pad.

5. The IC of claim 1, wherein an inductance of the inductor is set based at least in part on the total capacitance to match, at a selected frequency, the characteristic impedance expected for a signal line connecting to the substrate pad.

6. The IC of claim 1, further comprising:
   a second pin configured to connect to a second substrate pad via a second solder bump having a second parasitic capacitance;
   a second inductor that couples the second pin to said transmit or receive circuit to carry a differential signal;

a third electrostatic discharge (ESD) protection device electrically connected to a pin end of the second inductor; and a fourth ESD protection device electrically connected to a circuit end of the inductor, wherein the third ESD protection device has a third capacitance that sums with the second parasitic capacitance to equal a second total capacitance coupled to the circuit end of the second inductor.

7. An method of providing an integrated circuit pin with electrostatic discharge (ESD) protection, the method comprising:

estimating a parasitic capacitance of a solder bump connecting the pin to a substrate pad;

coupling the pin to an on-chip circuit with an inductor;

connecting a first ESD protection device to a pin end of the inductor, the first ESD protection device having a first capacitance that combines with the parasitic capacitance to provide a first total capacitance at the pin end; and connecting a second ESD protection device to a circuit end of the inductor, the second ESD protection device having a second capacitance that combines with a capacitance of the on-chip circuit to provide a second total capacitance at the circuit end, wherein the first total capacitance matches the second total capacitance.

8. The method of claim 7, wherein the on-chip circuit includes a transmit circuit of a serializer/deserializer.

9. The method of claim 7, wherein the on-chip circuit includes a receive circuit of a serializer/deserializer.

10. The method of claim 9, wherein the second total capacitance includes a parasitic capacitance of a termination element.

11. The method of claim 7, wherein the inductor has an inductance that, in combination with the first and second total capacitances, matches a characteristic impedance of a substrate signal line attached to the pad with an input or output impedance of said pin when soldered.

12. The method of claim 11, further comprising: determining a working frequency for a signal to be communicated via the pin, wherein said characteristic impedance matching occurs at the working frequency.

13. The method of claim 7, further comprising:

determining a working frequency for a signal to be communicated via the pin; and selecting a total ESD protection device size based at least in part on the working frequency, wherein the first ESD protection device and second ESD protection device together provide the total ESD protection device size.

14. The method of claim 13, further comprising:

evaluating performance of the first and second ESD protection devices in response to an ESD event at the pin; and increasing a size of at least one of the first and second ESD protection devices if the performance is inadequate.

15. The method of claim 14, wherein said increasing includes:

increasing the total ESD protection device size; and apportioning the increase between the first and second ESD protection devices to maintain the match between the first and second total capacitances.

16. The method of claim 7, further comprising: determining design parameter values for the inductor by including impedance match as a optimization parameter.

* * * * *

UNITED STATES PATENT AND TRADEMARK OFFICE
CERTIFICATE OF CORRECTION

PATENT NO. : 10,971,458 B2
APPLICATION NO. : 16/241481
DATED : April 6, 2021
INVENTOR(S) : Xike Liu It is certified that error appears in the above-identified patent and that said Letters Patent is hereby corrected as shown below:

In the Specification

Column 2, Line 2, please replace "device" with --devices--.

Column 2, Line 8, please replace "limits" with --limit--.

Column 3, Line 22, please replace "couple" with --coupled--.

Column 3, Line 24, please replace "thus" with --,which--.

Column 3, Line 28, please insert --the-- before "bump".

Column 6, Line 61, please replace "depends" with --depend--.

In the Claims

Column 9, Line 10, Claim 7, please replace "An method" with --A method--.

Signed and Sealed this
Twentieth Day of July, 2021

Drew Hirshfeld
*Performing the Functions and Duties of the*
*Under Secretary of Commerce for Intellectual Property and*
*Director of the United States Patent and Trademark Office*